(12) United States Patent
Chikawa et al.

(10) Patent No.: US 6,836,002 B2
(45) Date of Patent: Dec. 28, 2004

(54) SEMICONDUCTOR DEVICE (75) Inventors: Yasunori Chikawa, Kitakatsuragi-gun (JP); Hiroaki Kitazaki, Soraku-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/799,877

(22) Filed: Mar. 7, 2001

(65) Prior Publication Data
US 2001/0020735 A1 Sep. 13, 2001

(30) Foreign Application Priority Data

Mar. 9, 2000 (JP) ........................................ 2000-065435

(51) Int. Cl.[7] .............................................. H01L 23/495
(52) U.S. Cl. ...................... 257/666; 257/686; 257/784; 257/786; 257/777
(58) Field of Search ................................ 257/686, 784, 257/786, 777, 666

(56) References Cited

U.S. PATENT DOCUMENTS

| | | | | |
|---|---|---|---|---|
| 5,581,498 A | * | 12/1996 | Ludwig et al. ............... 365/63 |
| 5,858,815 A | | 1/1999 | Heo et al. |
| 6,104,084 A | * | 8/2000 | Ishio et al. .................. 257/666 |
| 6,118,176 A | * | 9/2000 | Tao et al. .................... 257/176 |
| 6,239,496 B1 | * | 5/2001 | Asada ......................... 257/685 |
| 6,351,028 B1 | * | 2/2002 | Akram ........................ 257/686 |
| 2001/0031508 A1 | * | 4/2001 | Danziger et al. ............. 438/17 |

FOREIGN PATENT DOCUMENTS

| | | | |
|---|---|---|---|
| JP | 62-165350 | * | 7/1987 |
| JP | 04-284663 | | 10/1992 |
| JP | 11-97571 A | | 4/1999 |

* cited by examiner

*Primary Examiner*—Kamand Cuneo
*Assistant Examiner*—Thanh Y. Tran
(74) *Attorney, Agent, or Firm*—Nixon & Vanderhye PC (57) ABSTRACT

A re-wiring layer is provided on a circuit-formed surface of an IC chip, in an area other than where external lead electrodes. In the process for forming a circuit of the IC chip, the re-wiring layer is formed in a step following to a circuit forming step, and the rewiring layer formation is executed as a part of the IC chip fabrication process. The re-wiring layer is provided with first electrode pads on a chip periphery, second electrode pads at positions closer to the IC chip than the positions of the first electrode pads, and wires or traces for connecting the first electrode pads with the second electrode pads according to the 1:1 correspondence therebetween. By so doing, it is possible to provide a semiconductor device that allows the number of possible combinations of sizes of the laminated semiconductor chips to increase, while ensuring that an increase in the package cost, an increase in the thickness of the package, and deterioration of the package production efficiency can be suppressed.

22 Claims, 5 Drawing Sheets

SEMICONDUCTOR DEVICE

FIELD OF THE INVENTION

The present invention relates to a semiconductor device composed of a plurality of semiconductor chips that are laminated and packaged.

BACKGROUND OF THE INVENTION

Conventionally, a semiconductor device called a stacked package that is composed of a plurality of semiconductor chips laminated and packaged has been well known. Such stacked packages are roughly classified into the following three types: (1) a package in which semiconductor chips are laminated on a lead frame that is widely used as a common semiconductor package; (2) a package in which semiconductor chips are laminated on a substrate made of a polyimide resin film on which wire patterns are formed; and (3) a package in which semiconductor chips are laminated on a rigid print substrate. The arrangement of the type (2) and a part of the arrangement of the type (3) are characterized in that the package size can be reduced to be approximate to a chip size, and such a package is called as CSP (Chip Size Package).

Combinations of a plurality of semiconductor chips laminated in one stacked package widely vary, including a combination of memory ICs, a combination of memory ICs and logic ICs, a combination of CMOS ICs and bipolar ICs. As a stacked package for use in a portable telephone, packages in which flush memories and SRAMs are laminated are widely used.

Figure 4:
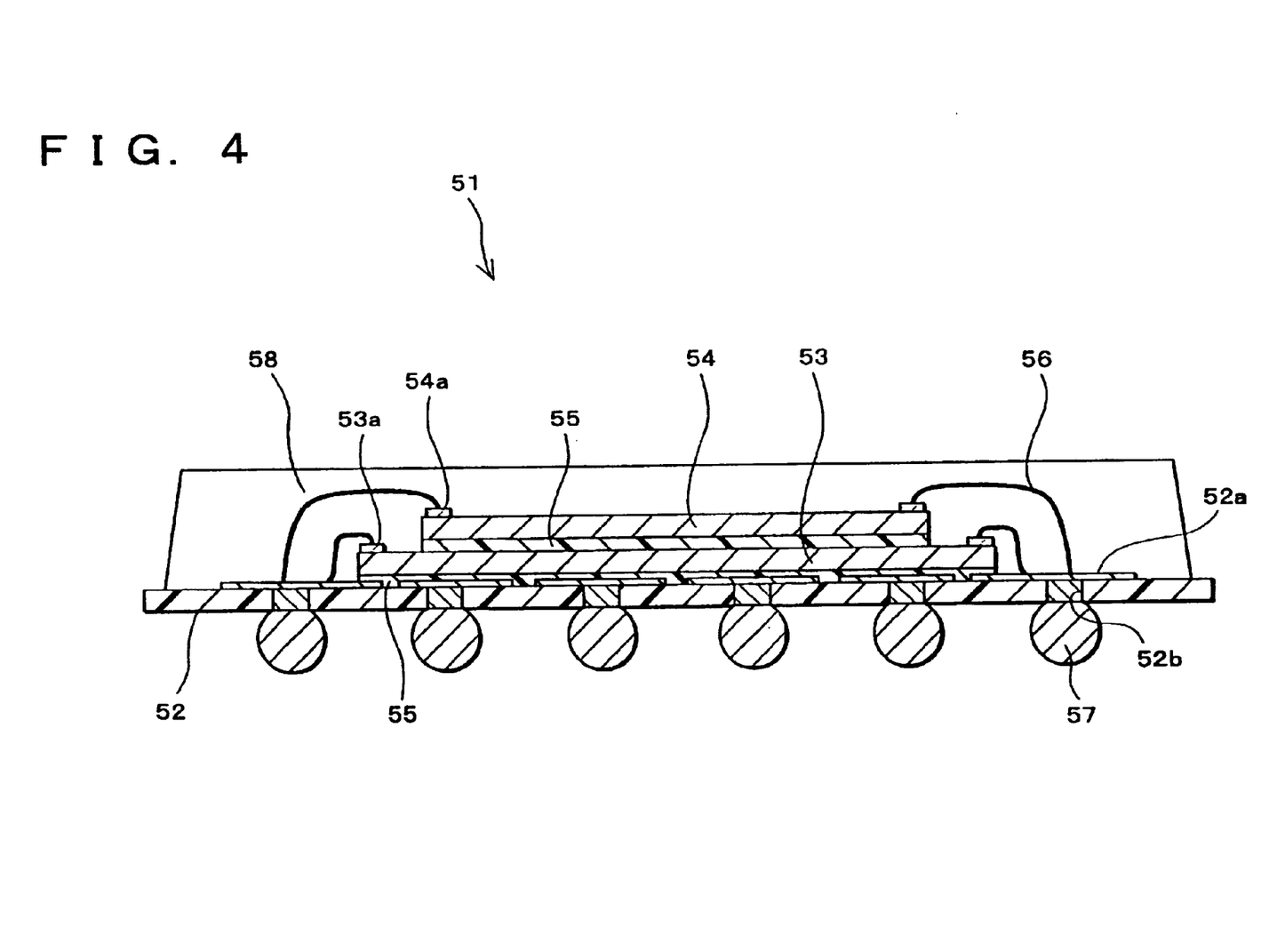
FIG. 4 is a cross-sectional view illustrating an arrangement of a conventional semiconductor device.

FIG. 4 illustrates an example of an arrangement of a CSP-type stacked package. The stacked package 51 is arranged by laminating an IC chip 53 and an IC chip 54 smaller than the IC chip 53, in the stated order, on a CSP substrate 52 as a lamination substrate, comprised of a polyimide substrate or a print substrate. The CSP substrate 52 and the IC chip 53 are made to adhere to each other, as are the IC chip 53 and the IC chip 54, with die bonding adhesive layers 55. The IC chips 53 and 54 are provided with external lead electrodes 53a and 54a, respectively, which are connected with package external lead electrodes 52a provided on the CSP substrate 52.

As a method for connection, as shown in the figure, a technique of wire bonding using wires 56 that are gold lines, for example, is widely applied. The wire bonding technique is also used in the case where the lamination substrate is a lead frame. The package external lead electrodes 52a are connected, via through holes 52b, with the solder ball electrodes 57 provided on a back surface of the CSP substrate 52. Then, on the front surface of the CSP substrate 52, the external lead electrodes 53a and 54a are sealed with resin 58 in a state of being electrically connected with the wires on the CSP substrate 52, whereby a whole of the stacked package 51 is arranged as one package.

Incidentally, in some cases, some of the external lead electrodes of the laminated IC chips are connected, not with the package external lead electrodes, but with external lead electrodes of other laminated IC chips.

However, the foregoing conventional stacked package arrangement raises the following problems in the case where lines are connected by wire bonding.

First of all, a limit on the length L of a wire is about 3 mm, which is determined according to the material characteristic of the wire. Further, a certain wire loop height should be ensured from the bonding surface vertically upward, so as to allow the wire to be bent toward the bonding destination after the start of bonding. Therefore, as a stacked package 61 shown in FIG. 5, the size of the IC chip 62 of the upper stratum is considerably smaller than that of the IC chip 53 of the lower stratum, and hence, in the case where the external lead electrodes 62a of the IC chip 62 and the package external lead electrodes 52a are connected with wires 56 over the IC chip 53 of the lower stratum, the lengths L of the wires 56 occasionally exceed the foregoing limit, depending on the size of the IC chip 53. In this case, there is a possibility that, during bonding, the wires 56 hang down to become in contact with the wires of the IC chip 53, or that the wires 56 are cut by half. In other words, combinations of sizes of IC chips that are allowed to be laminated are considerably limited.

Figure 5:
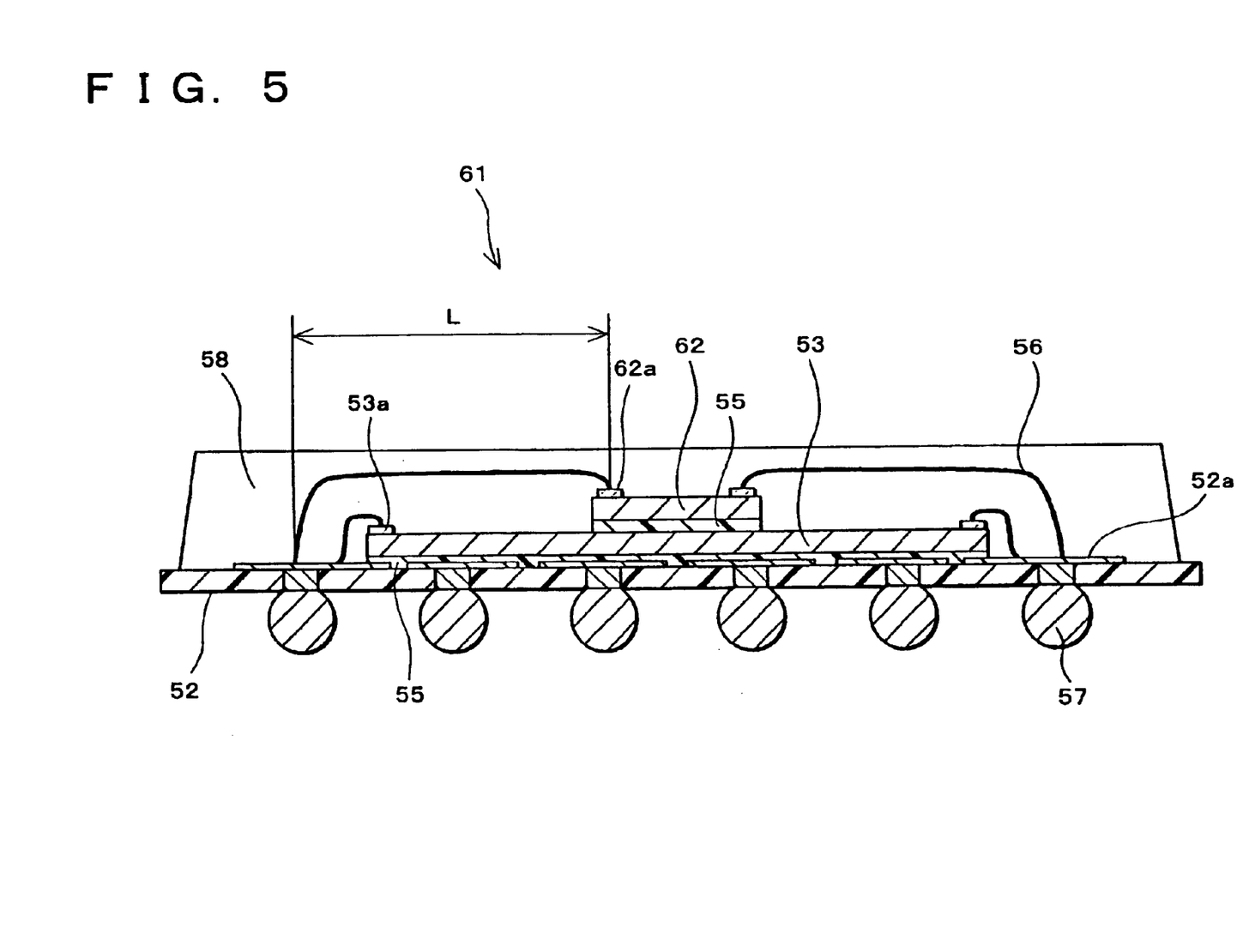
FIG. 5 is a cross-sectional view illustrating another example of an arrangement of the conventional semiconductor device.

Furthermore, the arrangement of external connection terminals of the package like the solder ball electrodes 57 as shown in FIGS. 4 and 5 is determined depending on a purpose of use, whereas, at which positions in the chip the external lead electrodes of the IC chip should be arranged is determined according to the IC design. Therefore, even in the case where the wires connecting the external lead electrodes of the IC chip and the package external lead electrodes of the lamination substrate are shorter in length than the foregoing limit, the foregoing position relationship of the external connection terminals and the external lead electrodes occasionally causes the wires to cross and become in contact with each other, thereby failing to connect wires.

Conventionally, as an approach to this problem, the following two techniques have been applied. The first technique is as follows: the IC chip lamination substrate is used as a multilaminar wire substrate, and wires are connected from the IC chip to wire-bonding positions on the lamination substrate, so that the bonding positions and the predetermined external connection terminals of the package are connected with wires inside the substrate.

The second technique is a technique disclosed in the Japanese Publication for Laid-Open Patent Application No. 97571/1999 (Tokukaihei 11-97571). According to this technique, a wire arrangement altering substrate that is called an interposer is formed, and wire bonding is carried out from an IC chip to positions of the interposer that are easily subjected to wire bonding. Then, wire bonding is carried out from positions of the interposer that are close to the package external lead electrodes, to the package external lead electrodes. The foregoing bonding positions of two kinds on the interposer are connected with each other via internal wires of the interposer.

However, the foregoing two techniques have the following drawbacks: (1) since the multilaminar wire substrate and the interposer are expensive, this leads to a drastic increase in the package cost; (2) the interposer described in the aforementioned publication requires as high-level a microprocessing technique as that for IC chip fabrication, and a special process and a special site for fabrication of the interposer are required; (3) a thickness of a package increases in the case where the multilaminar wire substrate and the silicon interposer are used, failing to be reduced to a thickness smaller than the predetermined thickness. Furthermore, here, a change of the package thickness produces a need to change the package assembling process, equipments, jigs, instruments, etc., and general-use equipments cannot be shareably used.

Incidentally, in the case where direct connection with wires between the external lead electrodes of the semiconductor chip and the package external lead electrodes requires a wire length excessive of the foregoing limit, the wires may be shortened with use of the foregoing interposer inserted between strata of the semiconductor chips, but there is no change in the situation where inconveniences described in the foregoing (1) through (3) take place.

Thus, conventionally there has been the following problem: that is', in increasing the number of possible combinations of sizes of semiconductor chips to be laminated, or in preventing wires from becoming in contact with each other in wire bonding for connecting the external lead electrodes of all semiconductor chips laminated with external connection terminals of the package, a drastic rise of the package cost, a considerable increase in the thickness of the package, and a drastic decrease in the package fabrication efficiency are unavoidable. This problem obviously becomes severer as the number of semiconductor chips to be laminated increases.

SUMMARY OF THE INVENTION

An object of the present invention is to provide a semiconductor device including a plurality of laminated semiconductor chips as in a stacked package, that is arranged so that the number of possible combinations of sizes of the laminated semiconductor chips can be increased while an increase in the package cost, an increase in the thickness of the package, and deterioration of the package production efficiency can be suppressed.

To achieve the foregoing object, a semiconductor device in accordance with the present invention is a semiconductor device in which a plurality of semiconductor chips equipped with external lead electrodes are laminated on a lamination substrate and packaged in a state in which the external lead electrodes are electrically connected with wires of the lamination substrate, and is characterized by comprising, on a circuit-formed surface of at least one of the semiconductor chips, (i) first electrode pads disposed on a periphery of the chip, (ii) second electrode pads disposed at positions closer to the semiconductor chip immediately above the at least one semiconductor chip, than the positions of the first electrode pads, and (iii) a re-wiring layer having wires (or traces) connecting the first electrode pads and the second electrode pads.

According to the foregoing arrangement, a re-wiring layer as described above is provided on a circuit-formed surface of one semiconductor chip. The re-wiring layer is provided with two kinds of electrode pads, which are first electrode pads provided on a periphery of the chip and second electrode pads provided closer to the semiconductor chip immediately above than the first electrode pads. Further, the first electrode pads and the second electrode pads are connected with traces.

The second electrode pads can be used as, for example, bonding pads for wire bonding with a semiconductor chip of a further upper stratum, as well as use as electrodes for flip-chip bonding with the semiconductor chip immediately above. In the case where the second electrode pads are used as bonding pads, it is possible to extend the electric connection by wire bonding from the first electrode pads via wires. By providing the first and second electrode pads as described above, rather than direct wire bonding from a semiconductor chip of an upper stratum to wires of a lamination substrate, wire bonding should preferably be executed a plurality of times via a semiconductor chip having the re-wiring layer, whereby a length of each wire can be shortened. Therefore, even in the case of a combination of sizes of semiconductor chips that, if wire bonding is only once, would require a length of wires excessive of a limit thereof to connect the semiconductor chips with the lamination substrate, all the wires can be made shorter in length than the limit thereof.

Furthermore, since basically only formation of a wire layer such as a metal thin film and an insulating film on the circuit-formed surface is required, the re-wiring layer has a thickness overwhelmingly smaller than that of an interposer.

Thus, it is possible to provide a semiconductor device including a plurality of laminated semiconductor chips as in a stacked package, that is arranged so that the number of possible combinations of sizes of the laminated semiconductor chips can be increased while an increase in the package cost, an increase in the thickness of the package, and deterioration of the package production efficiency can be suppressed.

For a fuller understanding of the nature and advantages of the invention, reference should be made to the ensuing detailed description taken in conjunction with the accompanying drawings.

DESCRIPTION OF THE PREFERRED EMBODIMENTS

[First Embodiment]

Figure 1:
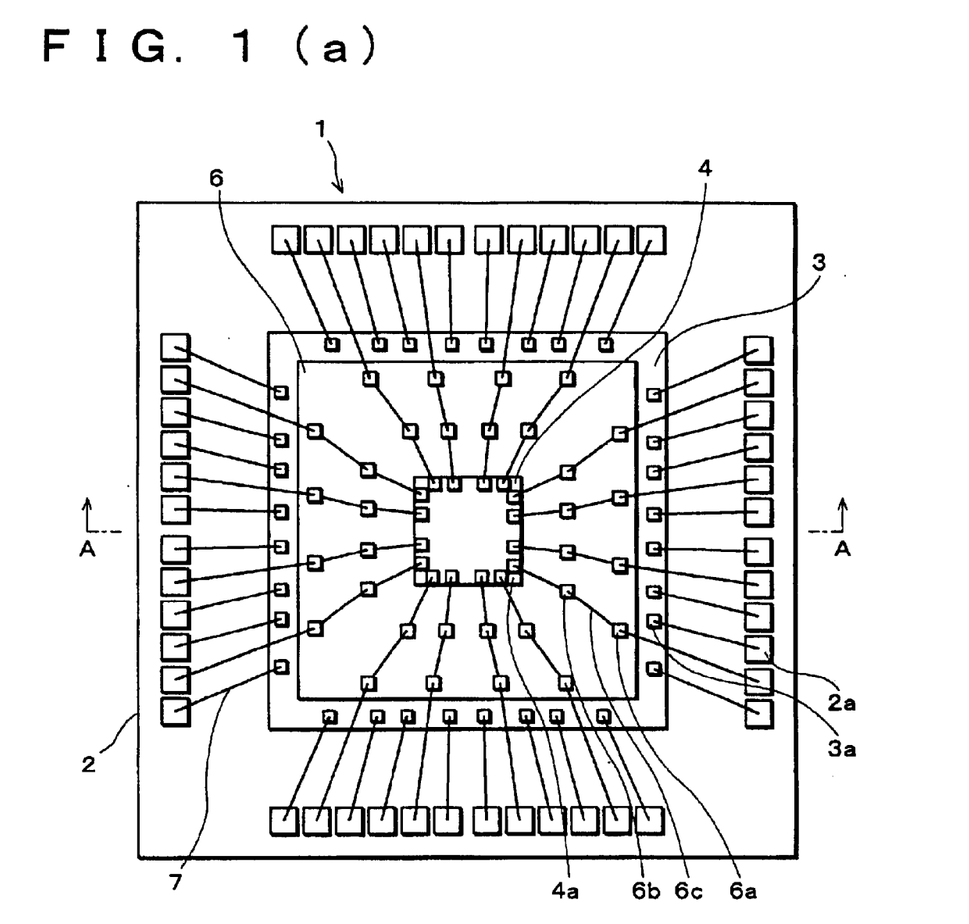
FIG. 1(a) is a plan perspective view illustrating an arrangement of a semiconductor device in accordance with one embodiment of the present invention.
FIG. 1(b) is a cross-sectional view taken along an A—A line in FIG. 1(a).
Figure 2:
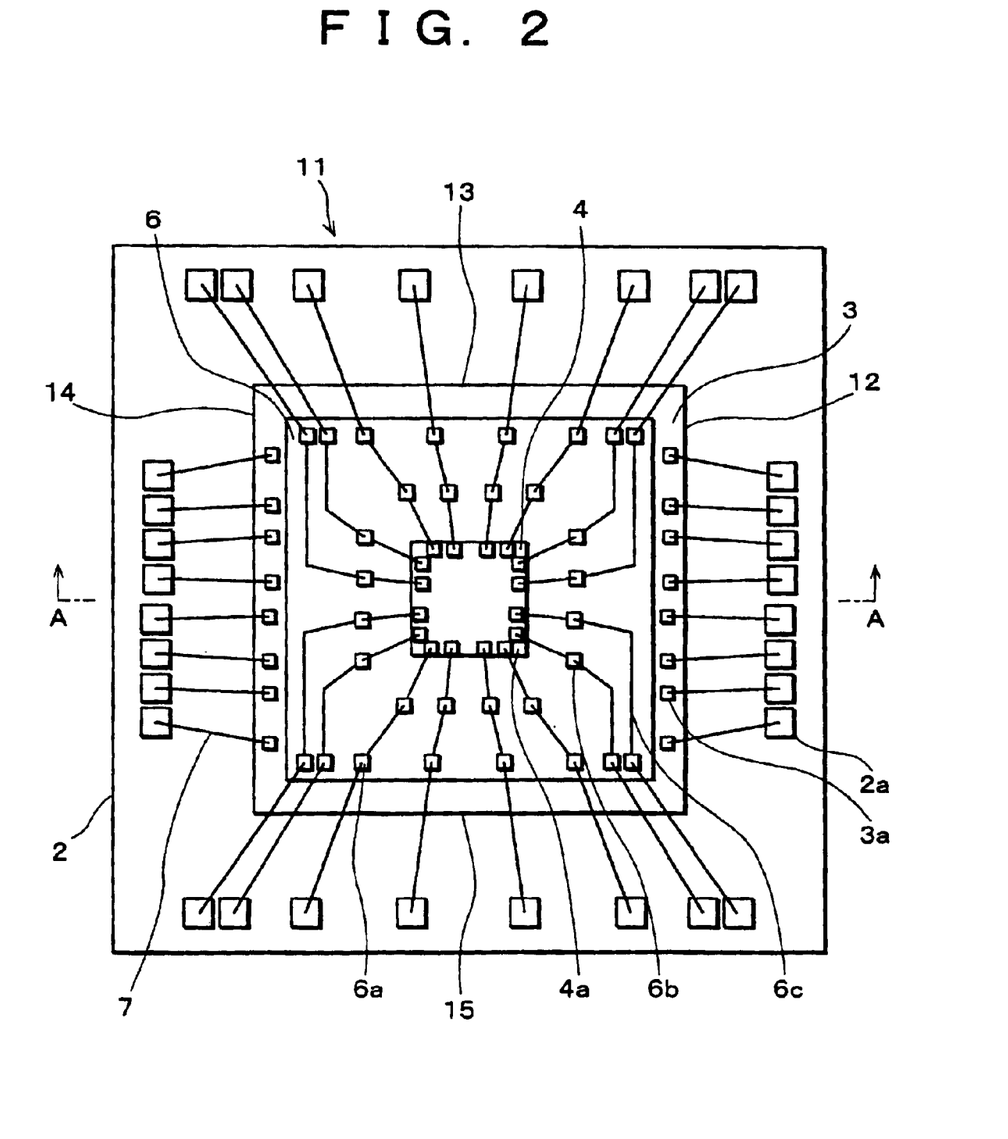
FIG. 2 is a plan perspective view illustrating an arrangement of a modification of the semiconductor device shown in FIGS. 1(a) and 1(b).

The following description will explain an embodiment of a semiconductor device of the present invention, while referring to FIGS. 1(a), 1(b), and 2.

FIGS. 1(a) and 1(b) illustrate an arrangement of a CSP-type stacked package 1 as a semiconductor device in accordance with the present embodiment. FIG. 1(a) is a plan perspective view of the stacked package 1 taken from above the lamination, while FIG. 1(b) is a cross-sectional view taken along an A—A line of FIG. 1(a). The stacked package 1 is formed by laminating an IC chip 3 as a semiconductor chip and an IC chip 4 smaller in chip size than the IC chip 3, in the stated order, on a CSP substrate 2 as a lamination substrate that is comprised of an insulating resin substrate such as a polyimide substrate or a print substrate. Incidentally, the lamination substrate may be a lead frame provided that the package is in a size suitable for mass-production, and use of an insulating resin substrate enables to provide packages mounted thereon at a high density. Die bonding adhesive layers 5 are respectively provided for adhesion between the CSP substrate 2 and the IC chip 3 as well as between the IC chip 3 and the IC chip 4.

The IC chips 3 and 4 are equipped with circuits formed on respective upper sides of the strata thereof, as well as external lead electrodes 3a and 4a for connection with the external, respectively. Further, on the circuit-formed surface of the IC chip 3, a re-wiring layer 6 is provided so as to keep away from the external lead electrodes 3a. The re-wiring layer 6 is formed following to the circuit formation in fabrication of the IC chip 3. In other words, the formation of the re-wiring layer 6 constitutes a part of the fabrication of the IC chip 3.

The IC chip 3 is normally arranged so that a circuit element such as a transistor is formed on a silicon substrate. A surface of the circuit part other than electrode pads of the external lead electrodes is covered with an insulating film as a surface protection film that is made from SiN or polyimide and that is referred to as passivation film (surface protection film). The foregoing re-wiring layer 6 is obtained by forming a wire layer comprised of one or a multiplicity of metal thin films and an insulating film on the passivation film in the foregoing circuit fabrication process, keeping the wire layer in an electrically disconnected state from the circuit of the IC chip 3. Incidentally, if necessary, a wire layer directly connected with the circuit of the IC chip 3 may be formed in the re-wiring layer 6.

The foregoing wire layer includes first electrode pads 6a, second electrode pads 6b, and traces 6c. The first electrode pads 6a are disposed along a periphery of the IC chip 3. The second electrode pads 6b are disposed closer to the IC chip 4 of the upper stratum, than the positions of the first electrode pads 6a are. The traces 6c connect the first electrode pads 6a with the second electrode pads 6b, respectively, at 1:1 correspondence. The traces 6c may be exposed as far as they are not in contact with other metal parts, but they are preferably covered with the passivation film. Therefore, the first electrode pads 6a, the second electrode pads 6b, and the external lead electrodes 3a are provided in an exposed state, on the upper side to the stratum of the IC chip 3.

In the present embodiment, wire bonding is executed by utilizing the re-wiring layer 6. The external lead electrodes 4a of the IC chip 4 are connected to the second electrode pads 6b of the IC chip 3, with wires 7 formed with gold wires or the like, respectively. Furthermore, the first electrode pads 6a of the IC chip 3 are connected to the package external lead electrodes 2a as wires of the CSP substrate 2, with the wires 7, respectively. Furthermore, the external lead electrodes 3a of the IC chip 3 are connected to, among the package external lead electrodes 2a, the others than those connected with the first electrode pads 6a of the IC chip 3, with the wires 7. Incidentally, FIG. 1(b) is a view of the wire bonding state that is shown differently from FIG. 1(a) for conveniences' sake, so as to illustrate that the wires 7 connected to the package external lead electrodes 2a do not cross each other.

The package external lead electrodes 2a are respectively connected, via through holes 2b, to solder ball electrodes 8 provided on a back surface of the CSP substrate 2. Then, on the front surface of the CSP substrate 2, as described above, the external lead electrodes 3a and 4a of the IC chips 3 and 4 are sealed with resin 9 in a state of being electrically connected with the package external lead electrodes 2a of the CSP substrate 2, whereby the whole of the stacked package 1 is arranged as one package.

As described above, the second electrode pads 6b of the re-wiring layer 6 are used as bonding pads for use in wire bonding with the external lead electrodes 4a of the upper IC chip 4. Further, the first electrode pads 6a of the re-wiring layer 6 are used as bonding pads for use in wire bonding with the package external lead electrodes 2a of the CSP substrate 2. Furthermore, the second electrode pad 6b and the first electrode pads 6a are connected with each other with the traces 6c. This follows that the external lead electrodes 4a are connected with the package external lead electrodes 2a via the second electrode pads 6b, the traces 6c, and the first electrode pads 6a.

Thus, with the arrangement in which wire bonding is carried out for a plurality of times via the IC chip 3 equipped with the re-wiring layer 6, it is possible to shorten the length of each wire 7, as compared with the case where the external lead electrodes 4a of the upper IC chip 4 are directly wire-bonded with the package external lead electrodes 2a of the CSP substrate 2. Therefore, even in the case of a combination of sizes of the IC chips 3 and 4 that, if wire bonding is only once, would require a length of the wire 7 excessive of the limit thereof to connect the external lead electrodes 4a of the IC chip 4 with the package external lead electrodes 2a of the CSP substrate 2, all the wires 7 can be made shorter in length than the limit thereof by providing the re-wiring layer 6 in the IC chip 3.

Furthermore, since the same process as that for formation of the circuit of the IC chip 3 can be applied to the formation of the re-wiring layer 6, it is possible to form the re-wiring layer 6 at a high efficiency at lower costs. Furthermore, as described above, basically only provision of the wire layer and the insulating film on the circuit-formed surface is required, and hence, the thickness of the re-wiring layer 6 becomes overwhelmingly thinner than that of an interposer.

Furthermore, in the present embodiment, as shown in FIG. 1(a), wire bonding is performed without causing any wires 7 to cross each other. This is realized by: (1) that the second electrode pads 6b of the IC chip 3 are arranged around the IC chip 4 in the same order that the external lead electrodes 4a of the IC chip 4 respectively corresponding to the second electrode pads 6b are arranged; and (2) that the first electrode pads 6a of the IC chip 3 are arranged so as to be wire-bonded to the package external lead electrodes 2a through spaces between the wires 7 that connect the external lead electrodes 3a of the IC chip 3 with the package external lead electrodes 2a of the CSP substrate 2. Incidentally, in the figures, the distance of wire-bonding becomes shorter as the position of the first electrode pad 6a is closer to the periphery of the IC chip 3. Therefore, in the case where there are sufficient areas between the adjacent external lead electrodes 3a of the IC chip 3, the first electrode pads 6a are preferably disposed in the foregoing areas.

Furthermore, it is possible to execute wire bonding by designing an arrangement of the external lead electrodes 3a of the IC chip 3, the external lead electrodes 4a of the IC chip 4, and the package external lead electrodes 2a of the CSP substrate 2, like a stacked package 11 as shown in FIG. 2, so that no wire 7 crosses another wire 7. In the stacked package 11 shown in the foregoing figure, in the IC chip 3 that has four side portions 12 through 15 in a periphery thereof, the external lead electrodes 3a are provided only on the side portions 12 and 14 that are opposite to each other.

Furthermore, the package external lead electrodes 2a connected with the external lead electrodes 3a on the side portion 12 are disposed at positions closer to the side portion 12, while the package external lead electrodes 2a connected with the external lead electrodes 3a on the side portion 14 are disposed at positions closer to the side portion 14. Furthermore, the package external lead electrodes 2a connected with the first electrodes pads 6a of the IC chip 3 are disposed only on two side portions 13 and 15 in the chip periphery that are opposite to each other.

Furthermore, the external lead electrodes 4a of the IC chip 4 are disposed at the same positions as shown in FIG. 1(a).

Therefore, the first electrode pads 6a connected to the package external lead electrodes 2a disposed close to the side portion 13 are disposed on the side portion 13 side, while the first electrode pads 6a connected with the package external lead electrodes 2a disposed close to the side portion 15 are disposed on the side portion 15 side. This arrangement sufficiently prevents the wires 7 from crossing.

Thus, to achieve wire bonding without crossing, generally, arrangement of the first electrode pads 6a and the second electrode pads 6b in the re-wiring layer 6 may be determined as follows. Viewing the first electrode pads 6a from above the lamination of the semiconductor chips (herein the IC chips 3 and 4), segments connecting the first electrode pads 6a with their wire-bonding targets (herein the package external lead electrodes 2a of the CSP substrate 2), and segments connecting the semiconductor chips (herein the IC chips 3 and 4) with their wire-bonding targets (herein the package external lead electrodes 2a of the CSP substrate 2) are provided so as to be separated in an in-plane direction. Viewing the second electrode pads 6b from above the lamination, all segments connecting the second electrode pads 6b with wire-bonding origins (herein the external lead electrodes 4a of the IC chip 4) of the semiconductor chip of the upper stratum (herein the IC chip 4) are provided so as to be separated from each other in an in-plane direction.

Such an arrangement of the first and second electrode pads 6a and 6b does not cause the wires 7 to cross with each other in the lamination vertical direction, thereby easily avoiding contact of the wires 7 with each other. Here, in the re-wiring layer 6, traces 6c may be provided to connect the first electrode pads 6a and the second electrode pads 6b that are in pairs according to the positions of the first electrode pads 6a and the second electrode pads 6b.

Therefore, even in the case where the external lead electrodes of the semiconductor chips (herein the external lead electrodes 3a of the IC chip 3 and the external lead electrodes 4a of the IC chip 4) and the package external lead electrodes of the lamination substrate (herein the package external lead electrodes 2a of the CSP substrate 2) are disposed at positions such that only once of wire bonding could cause the wires 7 to be brought into contact with each other, the use of the re-wiring layer 6 eliminates the possibility that the wires 7 could be in contact with each other. The re-wiring layer 6 allows the manufacturing costs to be suppressed and has a smaller thickness, as compared with the interposer or the multilaminar wire substrate. Moreover, the re-wiring layer S can be easily formed in the circuit fabrication of the semiconductor chip.

Thus, according to the present embodiment, it is possible to provide a semiconductor device that includes a plurality of laminated semiconductor chips like a stacked package and that is arranged so that the number of possible combinations of sizes of the semiconductor chips laminated can be increased while an increase in the package cost, an increase in the thickness of the package, and deterioration of the package production efficiency can be suppressed. Furthermore, it is possible to provide a semiconductor device that is arranged so that wires should not be brought into contact with each other in wire bonding for providing electric connection of the external lead electrodes of all the semiconductor chips laminated with the external connection terminals of the package, while an increase in the package cost, an increase in the thickness of the package, and deterioration of the package production efficiency should be suppressed.

[Second Embodiment]

Figure 3:
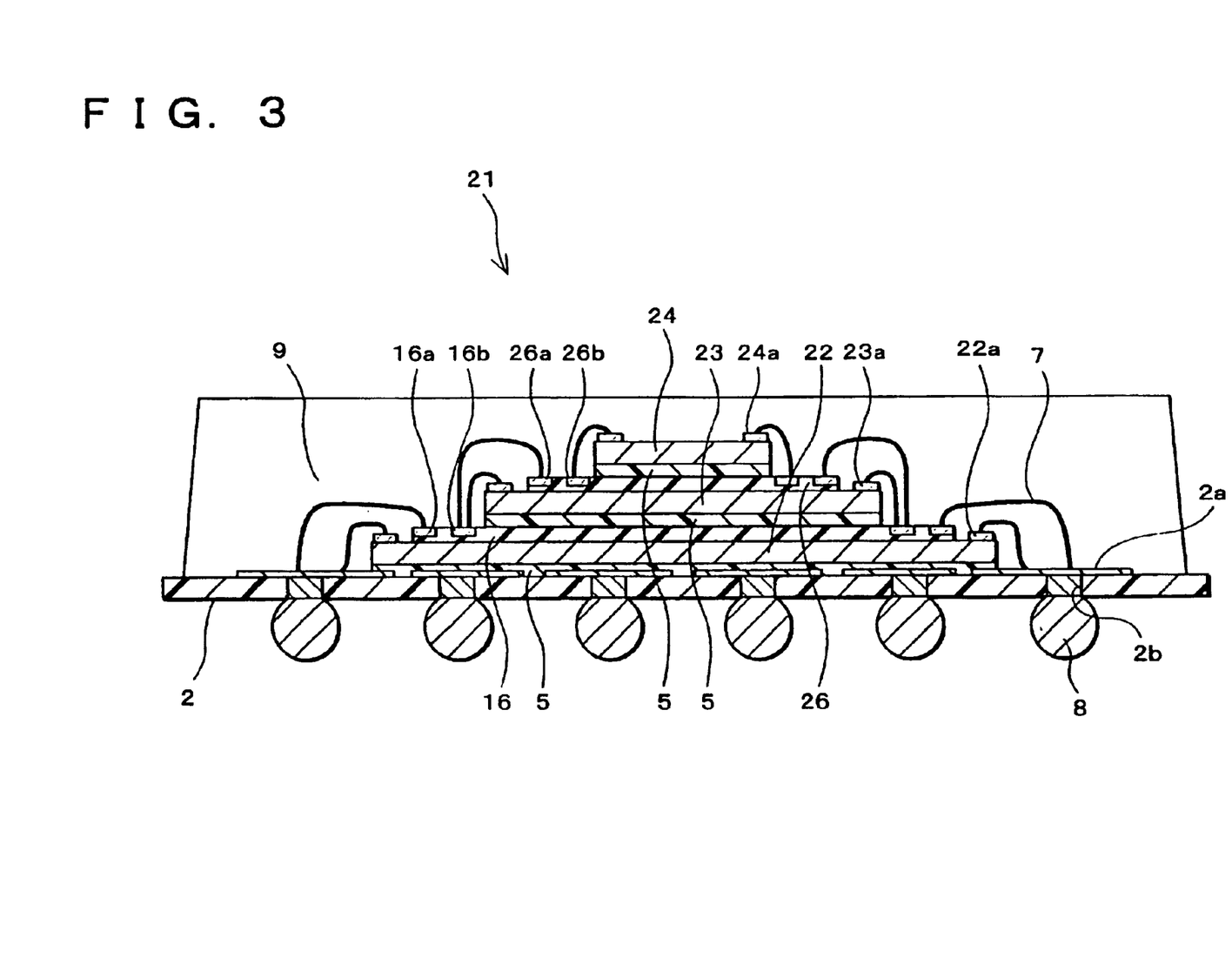
FIG. 3 is a cross-sectional view illustrating an arrangement of a semiconductor device in accordance with another embodiment of the present invention.

The following description will explain another embodiment of a semiconductor device in accordance with the present invention, while referring to FIG. 3. Incidentally, the members having the same structure (function) as those in the first embodiment will be designated by the same reference numerals and their description will be omitted.

FIG. 3 illustrates an arrangement of a stacked package 21 as a semiconductor device in accordance with the present embodiment. The stacked package 21 is formed by laminating an IC chip 22, an IC chip 23, and an IC chip 24 as semiconductor chips in the stated order, and a re-wiring layer 16 and a re-wiring layer 26 that are identical to the re-wiring layer 6 described in the first embodiment are provided on the IC chip 22 and the IC chip 23, respectively. The IC chip 22 is the largest in size, followed by the IC chip 23, then, the IC chip 24, and the IC chips 22, 23, and 24 include external lead electrodes 22a, external lead electrodes 23a, and external lead electrodes 24a, respectively.

The re-wiring layer 16 is provided with first electrode pads 16a identical to the first electrode pads 6a of the first embodiment, and second electrode pads 16b identical to the second electrode pads 6b of the first embodiment. Furthermore, not shown in the figure, the first electrode pads 16a and the second electrode pads 16b are connected with each other with traces identical to the traces 1 of the first embodiment. The re-wiring layer 26 is provided with first electrode pads 26a identical to the first electrode pads 6a of the first embodiment, and second electrode pads 26b identical to the second electrode pads 6b of the first embodiment. Though not shown in the figure, the first electrode pads 26a and the second electrode pads 26b are connected with traces identical to the traces 6c of the first embodiment.

The external lead electrodes 24a of the IC chip 24 are connected with the second electrode pads 26b of the IC chip 23. The first electrode pads 26a and the external lead electrodes 23a of the IC chip 23 are connected with the second electrode pads 16b of the IC chip 22. The first electrode pads 16a and external lead electrodes 22a of the IC chip 22 are connected with the package lead electrodes 2a of the CSP substrate 2.

Thus, in such a trilaminar structure, rather than direct wire bonding from the external lead electrodes 23a and 24a of the IC chips 23 and 24 of the upper strata to the package external lead electrodes 2a of the CSP substrate 2, wire bonding should preferably be executed a plurality of times via the IC chips 22 and 23 respectively having the re-wiring layers 16 and 26, whereby a length of each wire 7 can be shortened.

Therefore, even in the case of a combination of sizes of the IC chips 22, 23 and 24 that, if wire bonding is only once, would require a length of the wire 7 excessive of the limit thereof to connect the external lead electrodes 23a and 24a of the IC chips 23 and 24 with the package external lead electrodes 2a of the CSP substrate 2, all the wires 7 can be made shorter in length than the limit thereof by providing the re-wiring layers 16 and 26 in the IC chips 22 and 23.

Furthermore, since it is easy to apply the same process to the formation of the re-wiring layers 16 and 26 as the process for formation of the circuits of the IC chips 22 and 23, it is possible to form the re-wiring layers 16 and 26 at a high efficiency at lower costs. Furthermore, as described above, basically only provision of the wire layer and the insulating film on the circuit-formed surface is required, and hence, the re-wiring layers 16 and 26 have a thickness overwhelmingly smaller than that of an interposer.

What is described above applies in the case where the number of IC chips in such a stratified form is not less than 4.

Incidentally, in the example shown in FIG. 3, the IC chips 22 and 23, other than the IC chip 24 at the top strata of the lamination, are both provided with the re-wiring layers, but the present invention is not limited to this. For instance, some of IC chips are not necessarily provided with re-wiring layers, provided that wire bonding that provides wires 7 so as to pass over any one or a plurality of IC chips does not require a length of the wires 7 excessive of the limit thereof, even in the case of not less than 4 strata of IC chips. However, as to each of IC chips except those at the top and bottom strata, all first electrode pads and external lead electrodes thereof are preferably connected to second electrode pads of an IC chip immediately beneath the foregoing chip by wire bonding. Furthermore, in an IC chip at the bottom stratum, first electrode pads and external lead electrodes thereof are preferably connected with wires of the lamination substrate by wire bonding. Moreover, in an IC chip at the top stratum, external lead electrodes thereof are preferably connected with second electrode pads of an IC chip immediately beneath the foregoing IC chip by wire bonding. This is because wire bonding of the IC chips is carried out stratum by stratum, which makes it possible to allows each of all the wires to become very short.

Furthermore, generally, as the number of strata of IC chips increases, there arises as a problem not only the difficulty of wire bonding associated with the length of the wires 7, but also the difficulty of wire bonding associated with the level difference between the wires 7, that is level difference between external lead electrodes of IC chips and package external lead electrodes of the lamination substrate. However, according to the foregoing arrangement in which at least one IC chip is provided with a re-wiring layer, the level difference in the wires 7 is divided into a plurality, which solves the aforementioned problem.

Furthermore, second electrode pads of an IC chip are not necessarily used as bonding pads for wire bonding. For instance, assume a case in which an area of a re-wiring layer is only slightly greater than an IC chip immediately above the same thereby making it impossible to provide a sufficient exposed area for provision of first electrode pads and second electrode pads both for wire bonding. In such a case, by allowing only the first electrode pads to be exposed while using the second electrode pads as electrodes for flip chip bonding with the IC chip immediately above, lamination is facilitated.

Furthermore, the arrangement of first electrode pads and second electrode pads that realizes the wire bonding that does not cause the wires 7 to cross, as described in the first embodiment, applies in the case where the number of the IC chips laminated is not less than 3.

Thus, according to the present embodiment, it is possible to provide a semiconductor device including a plurality of laminated semiconductor chips as in a stacked package, that is arranged so that the number of possible combinations of sizes of the semiconductor chips laminated can be increased while an increase in the package cost, an increase in the thickness of the package, and deterioration of the package production efficiency can be suppressed. Furthermore, it is possible to provide a semiconductor device that is arranged so that wires should not be brought into contact with each other in wire bonding for providing electric connection of the external lead electrodes of all the laminated semiconductor chips with the external connection terminals of the package, while an increase in the package cost, an increase in the thickness of the package, and deterioration of the package production efficiency can be suppressed.

As described above, a semiconductor device of the present invention is a semiconductor device in which a plurality of semiconductor chips equipped with external lead electrodes are laminated on a lamination substrate and packaged in a state in which the external lead electrodes are electrically connected with wires of the lamination substrate, and that is arranged so as to include, on a circuit-formed surface of at least one of the semiconductor chips except for the semiconductor chip of a top stratum that has a circuit-formed surface that is a surface on an upper side of the lamination:

first electrode pads disposed on a periphery of the chip;

second electrode pads disposed at positions closer to the semiconductor chip immediately above the at least one semiconductor chip, than the positions of the first electrode pads are; and a re-wiring layer having traces connecting the first electrode pads and the second electrode pads, wherein the first electrode pads, the second electrode pads, and the re-wiring layer are formed in a step following to a circuit forming step, in an area other than where the external lead electrodes are provided.

According to the foregoing arrangement, a re-wiring layer as described above is provided on a circuit-formed surface of at least one of the semiconductor chips except for the semiconductor chip of a top stratum that has a circuit-formed surface that is a surface on an upper side of the lamination. The re-wiring layer is provided with two kinds of electrode pads, which are first electrode pads provided on a periphery of the chip and second electrode pads provided closer to the semiconductor chip immediately above, than the first electrode pads are. Further, the first electrode pads and the second electrode pads are connected with traces. The formation of the re-wiring layer is carried out following to the circuit formation step in the fabrication of the semiconductor chip, which therefore constitutes a part of the fabrication of the semiconductor chip. Furthermore, since the re-wiring layer is formed on the circuit-formed surface, keeping away from the external lead electrodes, the first electrode pads, the second electrode pads, and the external lead electrodes are all in an exposed state on the upper surface of the semiconductor chip.

The second electrode pads can be used as bonding pads for wire bonding with a semiconductor chip of a further upper stratum, as well as use as electrodes for flip-chip bonding with the semiconductor chip immediately above. In the case where the second electrode pads are used as bonding pads, it is possible to extend the electric connection by wire bonding from the first electrode pads via wires. By providing the first and second electrode pads as described above, rather than direct wire bonding from a semiconductor chip of an upper stratum to wires of a lamination substrate, wire bonding should preferably be executed a plurality of times via a semiconductor chip having the re-wiring layer, whereby a length of each wire can be shortened. Therefore, even in the case of a combination of sizes of semiconductor chips that, if wire bonding is only once, would require a length of wires excessive of a limit thereof to connect the semiconductor chips with the lamination substrate, all the wires can be made shorter in length than the limit thereof.

Furthermore, since it is easy to apply the same process to the formation of the re-wiring layer as the process for formation of a circuit of a semiconductor chip, it is possible to form the re-wiring layer at a high efficiency at lower costs. Furthermore, as described above, basically only provision of a wire layer like a metal layer and an insulating film on the circuit-formed surface is required, and hence, the re-wiring layer has a thickness overwhelmingly smaller than that of an interposer.

Further, in the case where an area of a re-wiring layer is only slightly greater than a semiconductor chip immediately above thereby making it impossible to provide a sufficient exposed area for provision of first electrode pads and second electrode pads both for wire bonding, only the first electrode pads may be exposed while the second electrode pads may be used as electrodes for flip chip bonding with the semiconductor chip immediately above, whereby lamination is facilitated.

By so doing, it is possible to provide a semiconductor device including a plurality of laminated semiconductor chips as in a stacked package, that is arranged so that the number of possible combinations of sizes of the semiconductor chips laminated can be increased while an increase in the package cost, an increase in the thickness of the package, and deterioration of the package production efficiency should be suppressed.

Furthermore, a semiconductor device of the present invention may be arranged so that (i) the re-wiring layer is formed on each of the semiconductor chips except for the semiconductor chip of a top stratum, (ii) the first electrode pads and the external lead electrodes of each of the semiconductor chips except for the semiconductor chips of the top stratum and a bottom stratum are electrically connected with the second electrode pads of the semiconductor chip immediately beneath, (iii) the first electrode pads and the external lead electrodes of the bottom stratum are electrically connected with the wires of the lamination substrate, and (iv) the external lead electrodes of the semiconductor chip of the top stratum are electrically connected with the second electrode pads of the semiconductor chip immediately beneath.

According to the foregoing arrangement, as to each of semiconductor chips except those at the top and bottom strata, all first electrode pads and external lead electrodes thereof are connected to second electrode pads of a semiconductor chip immediately beneath by wire bonding. Furthermore, in a semiconductor chip at the bottom stratum, first electrode pads and external lead electrodes thereof are connected with wires of the lamination substrate by wire bonding. Moreover, in a semiconductor chip at the top stratum, external lead electrodes thereof are connected with second electrode pads of a semiconductor chip immediately beneath by wire bonding. This means that wire bonding of the semiconductor chips is carried out stratum by stratum, which makes it possible to allows each of all the wires to become very short.

Furthermore, a semiconductor device of the present invention may be, in the case where the first and second electrode pads are used for wire bonding, arranged so that, viewing from the upper side of lamination, the first electrode pads and the second electrode pads are arranged so that (i) all of segments that connect the first electrode pads of the semiconductor chip having the re-wiring layer with wire-bonding targets of the first electrode pads, and all of segments that connect the external lead electrodes of the same semiconductor chip with wire-bonding targets of the external lead electrodes should be separated from each other in an in-plane direction of the semiconductor chip, and (ii) all of segments that connect the second electrode pads of the semiconductor chip having the re-wiring layer with wire-bonding origins of the second electrode pads, the wire-bonding origins being on the semiconductor chip immediately above, should be separated from each other in an in-plane direction of the semiconductor chip.

Such an arrangement of the first and second electrode pads eliminates the need to provide the wires so as to cross with each other while being separated in the lamination vertical direction, thereby easily avoiding contact of the wires with each other. Even in the case where the both electrode pads are arranged as described above in the re-wiring layer, connection is enabled by laying wires therebetween according to their positions. Therefore, even in the case where external lead electrodes of a semiconductor chip and package external lead electrodes of a lamination substrate are disposed at positions such that only once of wire bonding could cause the wires to be brought into contact with each other, the use of the re-wiring layer eliminates the possibility that the wires could be in contact with each other. The re-wiring layer allows the manufacturing costs to be suppressed and has a thickness overwhelmingly smaller, as compared with an interposer or a multilaminar wire substrate. Moreover, the re-wiring layer can be easily formed in the circuit fabrication of the semiconductor chip.

By so doing, it is possible to provide a semiconductor device that is arranged so that wires should not be brought into contact with each other in wire bonding for providing electric connection of the external lead electrodes of all the laminated semiconductor chips with the external connection terminals of the package, while an increase in the package cost, an increase in the thickness of the package, and deterioration of the package production efficiency should be suppressed.

Furthermore, the semiconductor device of the present invention may be arranged so that the lamination substrate is a lead frame.

According to the foregoing arrangement in which the lamination substrate is a lead frame, it is possible to make the semiconductor device a package in a size suitable for mass-production.

Furthermore, the semiconductor device of the present invention may be arranged so that the lamination substrate is an insulating resin substrate having wires.

According to the foregoing invention, since the lamination substrate is an insulating resin substrate having wires, it allows the semiconductor devices formed thereon to be packages provided at a high density, like CSPs.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device, comprising:
   a plurality of semiconductor chips, equipped with respective external lead electrodes, being laminated on a lamination substrate; and
   at least one first re-wiring layer having a rectangular shape and being formed on a circuit-formed surface of one of said plurality of semiconductor chips where the re-wiring layer is formed via an insulating film, the re-wiring layer being provided between two of the plurality of semiconductor chips, said at least one re-wiring layer being thinner than any one of said plurality of semiconductor chips and being smaller in size than said one semiconductor chip where said re-wiring layer is formed,
   wherein said at least one first re-wiring layer includes:
      first electrode pads disposed directly on a periphery of said first re-wiring layer and electrically connected with traces of said lamination substrate;
      second electrode pads disposed directly on said first re-wiring layer at positions closer to a center of the first re-wiring layer than said first electrode pads and electrically connected with external lead electrodes of one of the plurality of semiconductor chips above the first re-wiring layer; and traces for electrically connecting said first electrode pads with said second electrode pads.

2. The semiconductor device as set forth in claim 1, wherein said lamination substrate is a lead frame.

3. The semiconductor device as set forth in claim 1, wherein said lamination substrate is an insulating resin substrate having traces.

4. The semiconductor device as set forth in claim 1, wherein the traces of said re-wiring layer are covered with an insulating film.

5. The semiconductor device as set forth in claim 1, said first electrode pads being provided between adjacent external lead electrodes of one of the plurality of semiconductor chips immediately below the at least one first re-wiring layer.

6. The semiconductor device as set forth in claim 1, wherein in a process of forming a circuit constituting one of the plurality of semiconductor chips immediately below the at least one first re-wiring layer, said first electrode pads are formed in a step following to a circuit forming step.

7. The semiconductor device as set forth in claim 1, wherein:

electric connections between said first electrode pads and said traces of the lamination substrate; and electric connections between external lead electrodes of one of the plurality of semiconductor chips below the at least one first re-wiring layer and said traces of the lamination substrate are realized with wire bonding, and all of wires used for said wire bonding do not intersect with each other in an in-plane direction of said semiconductor device.

8. The semiconductor device as set forth in claim 1, wherein electric connections between (i) said second electrode pads and (ii) external lead electrodes of one of the plurality of the semiconductor chips above the at least one first re-wiring layer are realized with wire bonding, and all of wires used for the wire bonding do not intersect with each other in an in-plane direction of said semiconductor device.

9. The semiconductor device as set forth in claim 1, wherein the insulating film is provided between said at least one first re-wiring layer and one of the plurality of the semiconductor chips immediately below said at least one first re-wiring layer.

10. The semiconductor device as set forth in claim 1, wherein electric connections between:

said second electrode pads; and external lead electrodes of one of the plurality of the semiconductor chips immediately above said at least one first re-wiring layer are realized with flip chip bonding.

11. The semiconductor device as set forth in claim 1, wherein external lead electrodes, of one of the plurality of semiconductor chips immediately below the at least one first re-wiring layer, are provided only on opposing two side portions among four side portions of said one of the plurality of semiconductor chips, and said first electrode pads are provided on other two opposing side portions among said four side portions.

12. A semiconductor device, comprising:

a plurality of semiconductor chips, equipped with respective external lead electrodes, being laminated on a lamination substrate;

at least one first re-wiring layer having a rectangular shape and being formed on a circuit-formed surface of one of said plurality of semiconductor chips where the re-wiring layer is formed via an insulating film, the re-wiring layer being provided between two of the plurality of semiconductor chips, said at least one re-wiring layer being smaller in size than said one semiconductor chip where said re-wiring layer is formed, wherein said at least one first re-wiring layer includes:

first electrode pads disposed directly on a periphery of said first re-wiring layer and electrically connected with traces of said lamination substrate;

second electrode pads disposed directly on said first re-wiring layer at positions closer to a center of the first re-wiring layer than said first electrode pads and electrically connected with external lead electrodes of one of the plurality of semiconductor chips above the first re-wiring layer; and traces for electrically connecting said first electrode pads with said second electrode pads at least one second re-wiring layer having a rectangular shape and being disposed between two of the plurality of semiconductor chips above the at least one first re-wiring layer, wherein the second re-wiring layer includes:

third electrode pads directly disposed on a periphery of said second re-wiring layer and electrically connected with said second electrode pads of the first re-wiring layer;

fourth electrode pads disposed directly on said second re-wiring layer at positions closer to a center of the second re-wiring layer than said third electrode pads and electrically connected with external lead electrodes of one of the plurality of semiconductor chips above the second re-wiring layer; and traces for electrically connecting said third electrode pads with said fourth electrode pads.

13. The semiconductor device as set forth in claim 12, wherein:

electric connections between said first electrode pads and said traces of the lamination substrate;

electric connections between said second electrode pads and external lead electrodes of one of the plurality of semiconductor chips above the at least one first rewiring layer; electric connections between said second electrode pads and said third electrode pads; and electric connections between said fourth electrode pads and external lead electrodes of one of the plurality of semiconductor chips above the at least one second re-wiring layer are realized with wire bonding.

14. The semiconductor device as set forth in claim 13, wherein wires used for said wire bonding do not intersect with each other in an in-plane direction of said semiconductor device.

15. The semiconductor device as set forth in claim 12, wherein electric connections between:

said fourth electrode pads; and external lead electrodes of one of the plurality of the semiconductor chips immediately above said at least one second re-wiring layer are realized with flip chip bonding.

16. A laminate-packaged semiconductor device, comprising:

not less than three semiconductor chips equipped with respective external lead electrodes and laminated on a lamination substrate; and not less than two re-wiring layers each being rectangular in shape and each being formed on a circuit-formed surface of a different one of said not less than three semiconductor chips and being provided between all pairs of adjacent semiconductor chips among said not less than three semiconductor chips, each one of said not less than two re-wiring layers being smaller in size than the semiconductor chip it was formed on, wherein,
each of said not less than two re-wiring layers includes;
first electrode pads disposed directly on a periphery of said re-wiring layer;
second electrode pads disposed directly on said re-wiring layer at positions closer to a center of said re-wiring layer than said first electrode pads; and
traces for electrically connecting said first electrode pads with said second electrode pads, and
(first connections) (i) first electrode pads of a lowest re-wiring layer among said not less than two re-wiring layers and (ii) external lead electrodes of a lowest semiconductor chip among said not less than three semiconductor chips are electrically connected to traces of said lamination substrate,
(second connections) (iii) first electrode pads of one of said not less than two re-wiring layers above said lowest re-wiring layer and (iv) external lead electrodes of a semiconductor chip immediately below said re-wiring layer in (iii) are electrically connected to second electrode pads of a re-wiring layer which is lower than said re-wiring layer in (iii) by one stratum, and
(third connections) second electrode pads of a highest re-wiring layer among said not less than two re-wiring layers are electrically connected to external lead electrodes of a highest semiconductor chip among said not less than three semiconductor chips.

17. The semiconductor device as set forth in claim 16, wherein said first, second, and third connections are realized with wire bonding.

18. The semiconductor device as set forth in claim 17, wherein all of wires used for said wire bonding do not intersect with each other in an in-plane direction of said semiconductor device.

19. The semiconductor device as set forth in claim 16, wherein said third connections are realized with flip chip bonding.

20. The semiconductor device as set forth in claim 16, each one of said not less than two re-wiring layers being thinner than any one of said not less than three semiconductor chips.

21. A laminate-packaged semiconductor device, comprising:
not less than three semiconductor chips equipped with respective external lead electrodes and laminated on a lamination substrate, said not less than three semiconductor chips being stacked above each other and having different sizes, with the semiconductor chip immediately adjacent the lamination substrate being largest and the semiconductor chip furthest from the lamination substrate being smallest; and
not less than two re-wiring layers provided between all pairs of adjacent semiconductor chips among said not less than three semiconductor chips, said not less than two re-wiring layers being rectangular in shape, being stacked above each other and having different sizes, with the re-wiring layer closest to the lamination substrate being largest and the re-wiring layer furthest from the lamination substrate being smallest, wherein,
each of said not less than two re-wiring layers includes;
first electrode pads disposed directly on a periphery of said re-wiring layer;
second electrode pads directly disposed on said re-wiring layer at positions closer to a center of said re-wiring layer than said first electrode pads; and
traces for electrically connecting said first electrode pads with said second electrode pads, and
(first connections) (i) first electrode pads of a lowest re-wiring layer among said not less than two re-wiring layers and (ii) external lead electrodes of a lowest semiconductor chip among said not less than three semiconductor chips are electrically connected to traces of said lamination substrate,
(second connections) (iii) first electrode pads of one of said not less than two re-wiring layers above said lowest re-wiring layer and (iv) external lead electrodes of a semiconductor chip immediately below said re-wiring layer in (iii) are electrically connected to second electrode pads of a re-wiring layer which is lower than said re-wiring layer in (iii) by one stratum, and
(third connections) second electrode pads of a highest re-wiring layer among said not less than two re-wiring layers are electrically connected to external lead electrodes of a highest semiconductor chip among said not less than three semiconductor chips.

22. A semiconductor device comprised of a plurality of rectangularly shaped semiconductor chips alternately laminated with a plurality of rectangularly shaped re-wiring layers on a laminated substrate so as to form a laminated pyramid structure with each semiconductor chip and each re-wiring layer being smaller than the underlying respective re-wiring layer or semiconductor chip it sits atop, wherein a largest semiconductor chip sits atop said lamination substrate with a smaller re-wiring layer sitting atop of said largest semiconductor chip, and a next largest semiconductor chip, smaller than said smaller re-wiring layer, sits atop said smaller re-wiring layer, wherein said smaller re-wiring layer includes first electrode pads disposed directly on a periphery of said smaller re-wiring layer and are electrically connected with traces of said lamination substrate, second electrode pads disposed directly on said smaller re-wiring layer at positions closer to a center of said smaller re-wiring layer than said first electrode pads and are electrically connected with external lead electrodes of said next largest semiconductor chip, and traces for electrically connecting said first electrode pads with said second electrode pads.

* * * * *